United States Patent
Wang

(10) Patent No.: US 9,349,883 B2
(45) Date of Patent: May 24, 2016

(54) CONDUCTOR FOR A SOLAR CELL

(71) Applicant: E I DU PONT DE NEMOURS AND COMPANY, Wilmington, DE (US)

(72) Inventor: Yueli Wang, Cary, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/714,529

(22) Filed: May 18, 2015

(65) Prior Publication Data

US 2015/0372171 A1 Dec. 24, 2015

Related U.S. Application Data

(60) Provisional application No. 62/106,381, filed on Jan. 22, 2015, provisional application No. 62/014,256, filed on Jun. 19, 2014.

(51) Int. Cl.

| H01L 31/00 | (2006.01) |
|---|---|
| H01B 1/02 | (2006.01) |
| H01L 31/0224 | (2006.01) |
| C09D 5/24 | (2006.01) |
| H01L 31/02 | (2006.01) |
| H01L 31/18 | (2006.01) |
| C03C 8/02 | (2006.01) |
| H01B 1/22 | (2006.01) |
| C03C 3/14 | (2006.01) |
| C03C 3/21 | (2006.01) |
| C03C 8/08 | (2006.01) |
| C03C 8/16 | (2006.01) |
| C03C 8/18 | (2006.01) |
| C03C 8/22 | (2006.01) |

(52) U.S. Cl.
CPC .......... *H01L 31/022425* (2013.01); *C03C 3/14* (2013.01); *C03C 3/21* (2013.01); *C03C 8/02* (2013.01); *C03C 8/08* (2013.01); *C03C 8/16* (2013.01); *C03C 8/18* (2013.01); *C03C 8/22* (2013.01); *C09D 5/24* (2013.01); *H01B 1/22* (2013.01); *H01L 31/0201* (2013.01); *H01L 31/02245* (2013.01); *H01L 31/022441* (2013.01); *H01L 31/18* (2013.01); *Y02E 10/50* (2013.01)

(58) Field of Classification Search
CPC .................. H01L 31/022425; Y02E 10/50
USPC ................ 136/252, 256; 252/250.4
See application file for complete search history.

(56) References Cited

U.S. PATENT DOCUMENTS

| 2009/0266409 A1 | 10/2009 | Wang et al. | |
| 2011/0232747 A1* | 9/2011 | Mikeska | B22F 1/0059 136/256 |
| 2011/0315937 A1* | 12/2011 | Aoyagi | H01B 1/16 252/514 |
| 2012/0312369 A1 | 12/2012 | Hang et al. | |
| 2013/0037096 A1 | 2/2013 | Hang et al. | |
| 2013/0037761 A1 | 2/2013 | Hang et al. | |

* cited by examiner

*Primary Examiner* — James Lin
*Assistant Examiner* — Lindsey Bernier

(57) ABSTRACT

The paste composition of the instant invention consists of silver powder, glass frit, $Bi_2O_3$, metal additives and an organic medium. The present invention is further directed to an electrode formed from the paste composition and a semi-conductor device and, in particular, a soar cell comprising such an electrode. The paste compositions provide a solderable electrode, particularly useful for forming solar cell back side buss bars on an aluminum layer that covers the entire back side surface of the solar cell.

9 Claims, 1 Drawing Sheet

CONDUCTOR FOR A SOLAR CELL

FIELD OF THE INVENTION

The present invention is directed to a paste composition and electrical conductors, particularly electrodes, formed from the composition. It is further directed to a silicon semiconductor device and, in particular, it pertains to the paste composition used in the formation of an electrode on the back side of a solar cell.

TECHNICAL BACKGROUND OF THE INVENTION

The present invention can be applied to a broad range of electrical devices, although it is especially effective in light-receiving elements such as photodiodes and solar cells. The background of the invention is described below with reference to solar cells as a specific example of the prior art.

A conventional solar cell structure with a p-type base has a negative electrode that is typically on the front side or sun side of the cell and a positive electrode on the back side. Radiation of an appropriate wavelength falling on a p-n junction of a semiconductor substrate serves as a source of external energy to generate hole-electron pairs in the substrate. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metallized, i.e., provided with metal electrodes that are electrically conductive.

Typically pastes are screen printed onto the solar cell substrate and fired to form the electrodes. For example a single crystal or multi-crystalline p-type silicon substrate has an n-type diffusion layer adjacent to the light-receiving front side surface. An insulating anti-reflection coating may be formed on the n-type diffusion layer. As shown in FIG. 1, the semiconductor substrate 101 has electrodes 102 on the front side. These electrodes are typically mainly composed of silver. The back side has a compound electrode comprising electrodes 103 mainly composed of aluminum, as well as electrodes 104 mainly composed of silver or some other solderable material. Although the electrode 103 may contain components other than aluminum, it is aluminum-based and will be referred to herein as an aluminum electrode. When the pastes are fired aluminum diffuses into the silicon substrate 101 to form a back surface field (BSF) layer 105. The back surface field serves to improve the energy conversion efficiency of the solar cell. The aluminum electrode 103 is not solderable. The solderable Ag-based electrodes 104 are printed in the gaps between areas of the non-solderable aluminum back side electrode. The solderable Ag-based electrodes 104 are necessary to serve as tabbing bus bars to which tabbing ribbons can be soldered. The areas under the tabbing bus bars 104 have no back surface field (BSF), as shown in FIG. 1, which results in up to 0.2% cell efficiency loss compared to a solar cell with a full area of back surface field.

In one embodiment, the object of this invention is to provide a paste that can be used to form a solderable electrode on portions of an aluminum back side electrode of a solar cell. The aluminum electrode will cover the entire surface of the back side and thus provide a full BSF. This eliminates a solar cell efficiency loss due to interrupted BSF under the silver-containing electrodes typically used to create back side electrodes. The solderable electrodes formed from the paste of the invention will serve as tabbing bus bars.

SUMMARY OF THE INVENTION

The invention provides a paste composition comprising:
(a) 40-80 wt % silver powder;
(b) 3-20 wt % glass frit containing 75-97 wt % $V_2O_5$, wherein the $V_2O_5$ wt % is based on the total weight of the glass frit,
(c) 0.1-3 wt % $Bi_2O_3$;
(d) 0-3 wt % metal selected from the group consisting of Cu, Zn, Ti, Mn, Fe, Co, Ni, Mo, Zr and mixtures thereof; and
(e) 10-30 wt % organic medium;
wherein the silver powder, the glass frit, the $Bi_2O_3$ and the metal are dispersed in the organic medium and wherein the wt % of the silver powder, the glass frit, the $Bi_2O_3$, the metal and the organic medium are based on the total weight of the paste composition.

In one such embodiment, the glass frit contains 85-97 wt % $V_2O_5$, based on the total weight of the glass frit. In another embodiment, the paste composition comprises 0.1-3 wt % of a metal selected from the group consisting of Cu, Zn and mixtures thereof, based on the total weight of the paste composition.

In one embodiment, the invention provides a paste composition consisting of:
(a) 40-80 wt % silver powder;
(b) 3-20 wt % glass frit selected from the group consisting of (i) a first frit consisting of 85-97 wt % $V_2O_5$ and 3-15 wt % $B_2O_3$, (ii) a second frit consisting of 75-85 wt % $V_2O_5$, 13-23 wt % $P_2O_5$ and 0.1-2 wt % $TiO_2$, (iii) a third glass frit consisting of 85-97 wt % $V_2O_5$, 2-14 wt % $B_2O_3$, 0.1-4 wt % $P_2O_5$ and 0.01-1 wt % $TiO_2$ and (iv) mixtures thereof, wherein the oxide wt % are based on the total weight of each glass frit, respectively:
(c) 0.1-3 wt % $Bi_2O_3$;
(d) 0-3 wt % metal selected from the group consisting of Cu, Zn, Ti, Mn, Fe, Co, Ni, Mo, Zr and mixtures thereof; and
(e) 10-30 wt % organic medium;
wherein the silver powder, the glass frit, the $Bi_2O_3$ and the metal are dispersed in the organic medium and wherein the wt % of the silver powder, the glass frit, the $Bi_2O_3$; the metal and the organic medium are based on the total weight of the paste composition.

In one such embodiment the glass frit consists of 85-97 wt % $V_2O_5$, based on the total weight of the glass frit. In still another embodiment, the paste composition consists of 0.1-3 wt % of a metal selected from the group consisting of Cu, Zn and mixtures thereof, based on the total weight of the paste composition, The invention also provides a solar cell comprising:
(i) an aluminum back side electrode covering the entire surface of the back side of the solar cell; and
(ii) a tabbing bus bar electrode formed by firing a paste composition comprising silver powder and a glass frit containing 75-97 wt % $V_2O_5$, wherein the $V_2O_5$ wt % is based on the total weight of the glass frit and wherein the paste composition is deposited onto portions of the aluminum back side electrode, In one such embodiment the glass frit contains 85-97 wt % $V_2O_5$, based on the total weight of the glass frit. In another embodiment, the paste composition further comprises 0.1-3 wt % $Bi_2O_3$, based on the total weight of the paste composition. In still another embodiment, the paste composition further comprises 0.1-3 wt % of a metal selected from the group consisting of Cu, Zn and mixtures thereof, based on the total weight of the paste composition.

In one embodiment of the solar cell, the paste composition consists of:
(a) 40-80 wt % silver powder;
(b) 3-20 wt % glass frit selected from the group consisting of (i) a first frit consisting of 85-97 wt % $V_2O_5$ and 3-15 wt % $B_2O_3$, (ii) a second frit consisting of 75-85 wt % $V_2O_5$, 13-23 wt % $P_2O_5$ and 0.1-2 wt % $TiO_2$, (iii) a third glass frit consisting of 85-97 wt % $V_2O_5$, 2-14 wt % $B_2O_3$, 0.1-4 wt % $P_2O_5$ and 0.01-1 wt % $TiO_2$ and (iv) mixtures thereof, wherein the oxide wt % are based on the total weight of each glass frit, respectively;
(c) 0.1—$Bi_2O_3$ 3 wt %,
(d) 0-3 wt % metal selected from the group consisting of Cu, Zn, Ti, Mn, Fe, Co, Ni, Mo, Zr and mixtures thereof; and
(e) 10-30 wt % organic medium;

wherein the silver powder, the glass frit, the $Bi_2O_3$ and the metal are dispersed in the organic medium and wherein the wt % of the silver powder, the glass frit, the $Bi_2O_3$, the metal and the organic medium are based on the total weight of the paste composition, In one such embodiment the glass frit contains 85-97 wt % $V_2O_5$, based on the total weight of the glass frit. In still another embodiment, the paste composition consists of 0.1-3 wt % of a metal selected from the group consisting of Cu, Zn and mixtures thereof, based on the total weight of the paste composition.

The invention also provides a process for forming a floating tabbing electrode on the back side of a solar cell, the process comprising the steps of:
(a) providing a silicon substrate having a front side and a back side;
(b) depositing an aluminum paste over the entire surface of the back side of the silicon substrate;
(c) drying the aluminum paste;
(d) depositing a paste composition onto portions of the dried aluminum paste, the paste composition comprising silver powder and a glass frit containing 75-97 wt % $V_2O_5$, wherein the $V_2O_5$ wt % is based on the total weight of the glass frit; and
(e) firing to form a floating tabbing electrode.

In one such embodiment the glass frit contains 85-97 wt % $V_2O_5$, based on the total weight of the glass frit. In another embodiment, the paste composition further comprises 0.1-3 wt % $Bi_2O_3$, based on the total weight of the paste composition. In still another embodiment, the paste composition consists of 0.1-3 wt % of a metal selected from the group consisting of Cu, Zn and mixtures thereof, based on the total weight of the paste composition.

BRIEF DESCRIPTION OF THE FIGS

DETAILED DESCRIPTION OF THE INVENTION

Figure 1:
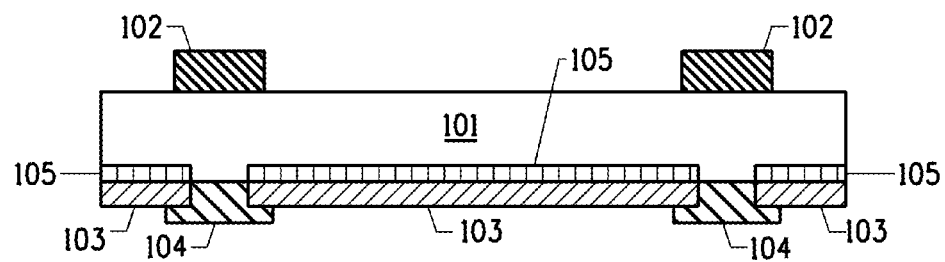
FIG. 1 illustrates the typical electrode configuration of a solar cell having a non-solderable aluminum back side electrode (obtained by firing back side aluminum paste) and a silver or silver/aluminum back side electrode (obtained by firing back side silver or silver/aluminum paste).

The conductive solderable paste composition of the instant invention provides the ability to have an aluminum electrode covering the entire back side surface of a solar cell. This results in a full area of back side field and an increase in solar cell efficiency of up to 0.2%. The paste composition of the instant invention is then printed on portions of the aluminum electrode and the electrodes formed from the paste composition serve as tabbing bus bars.

The paste composition of the instant invention contains silver powder, glass frit containing 75-97 wt % $V_2O_5$, $Bi_2O_3$, a metal selected from the group consisting of Cu, Zn, Ti, Mn, Fe, Co, Ni, Mo, Zr and mixtures thereof, and an organic medium. Each component of the paste composition of the present invention is discussed in detail below. Herein, weight percent is written as wt %.

Silver Powder

In the instant invention, the conductive phase of the paste is silver (Ag) powder. The silver can be in the form of silver metal, alloys of silver, or mixtures thereof. Typically, in a silver powder, the silver particles are in a flake form, a spherical form, a granular form, a crystalline form, other irregular forms and mixtures thereof. The silver can be provided in a colloidal suspension. The silver can also be in the form of silver oxide ($Ag_2O$), silver salts such as Aga, $AgNO_3$, AgO-$OCCH_3$ (silver acetate), $AgOOCF_3$ (silver trifluoroacetate), silver orthophosphate ($Ag_3PO_4$), or mixtures thereof. Other forms of silver compatible with the other paste components can also be used.

The silver may be uncoated or the surface at least partially coated with a surfactant. The surfactant may be selected from, but is not limited to, stearic acid, palmitic acid, lauric acid, oleic acid, capric acid, myristic acid and linolic acid and salts thereof, e.g., ammonium, sodium or potassium salts. In one embodiment the surfactant is diethylene glycol and the particle surfaces are essentially completely coated.

In one embodiment, the silver particles are in the form of spherical particles. In another embodiment, the silver is in the form of silver flake. In one embodiment, an average particle size of the silver flake is less than 10 microns. In another embodiment, the average particle size is less than 5 microns.

The silver is present in the paste in a proportion of 40 to 80 weight percent (wt %), based on the total weight of the paste. In another embodiment, the silver is present in the paste in a proportion of 55 to 75 wt %, based on the total weight of the paste.

Glass Frit

The instant paste composition consists of 3-20 wt % glass frit, based on the total weight of the paste. In one embodiment, the paste composition for forming a solderable back side electrode comprises 5-18 wt % glass frit. In another embodiment, the paste composition comprises 7-15 wt % glass frit.

In an embodiment, the glass frit has 75-97 wt % $V_2O_5$, wherein the wt % is based on the total weight of the glass frit. In another embodiment, the glass frit has 85-97 wt % $V_2O_5$, wherein the wt % is based on the total weight of the glass frit. In one embodiment, the glass frit contains no lead (Pb) and tellurium (Te), i.e. it is Pb-free and Te-free.

In one embodiment, the glass frit is selected from the group consisting of (i) a first glass frit consisting of 85-97 wt % $V_2O_5$ and 3-15 wt % $B_2O_3$, (ii) a second glass frit consisting of 75-85 wt % $V_2O_5$, 13-23 wt % $P_2O_5$ and 0.1-2 wt % $TiO_2$, (iii) a third glass frit consisting of 85-97 wt % $V_2O_5$, 2-14 wt % $B_2O_3$, 0.1-4 wt % $P_2O_5$ and 0.01-1 wt % $TiO_2$ a and (iv) mixtures thereof, wherein the oxide wt % are based on the total weight of each frit, respectively.

In one such embodiment, the first glass frit consists of 88-95 wt % $V_2O_5$ and 5-12 wt % $B_2O_3$. In an embodiment, the second glass frit consists of 78-83 wt % $V_2O_5$, 15-21 wt % $P_2O_5$ and 0.2-1 wt % $TiO_2$. In an embodiment, the third glass frit consists of 87-95 wt % $V_2O_5$, 4-10 wt % $B_2O_3$, 0.5-3 wt % $P_2O_5$ and 0.02-0.2 wt % $TiO_2$.

In one embodiment the glass frit consists of a mixture of the first glass frit and the second glass frit. In one such embodiment the glass frit consists of 85-95 wt % of the first glass frit and 5-15 wt % of the second glass frit, based on the total weight of the glass frit.

In still another embodiment the glass frit consists of a mixture of the first glass frit and the third glass frit. In one such embodiment the glass frit consists of 40-60 wt % of the first glass frit and 40-60 wt % of the third glass frit, based on the total weight of the glass frit.

In still another embodiment the glass frit consists of a mixture of the third glass frit and the second glass frit. In one such embodiment the glass frit consists of 85-95 wt % of the third glass frit and 5-15 wt % of the second glass frit, based on the total weight of the glass frit.

In other embodiments the glass frit consists of the first glass frit, the second glass frit, the third glass frit or a mixture of all three.

Glass compositions are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. The components of the glass composition may be supplied by various sources such as oxides, halides, carbonates, nitrates, phosphates, hydroxides, peroxides, halogen compounds and mixtures thereof. Herein, the composition of the first, second and third glass frits are given in terms of the equivalent oxides no matter the source of the various components. As recognized by one of ordinary skill in the art of glass chemistry, a certain portion of volatile species may be released during the process of making the glass. An example of a volatile species is oxygen.

The various glass frits may be prepared by mixing the oxides to be incorporated therein (or other materials that decompose into the desired oxides when heated, e.g., fluorides) using techniques understood by one of ordinary skill in the art. Such preparation techniques may involve healing the mixture in air or an oxygen-containing atmosphere to form a melt, quenching the melt, and grinding, milling, and/or screening the quenched material to provide a powder with the desired particle size. Melting the mixture of oxides to be incorporated therein is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $d_{50}$ of 0.1 to 3.0 microns. One skilled in the art of producing glass frit may employ alternative synthesis techniques such as but not limited to water quenching, sol-gel, spray pyrolysis, or others appropriate for making powder forms of glass.

The oxide product of the above process is typically essentially an amorphous (non-crystalline) solid material, i.e., a glass. However, in some embodiments the resulting oxide may be amorphous, partially amorphous, partially crystalline, crystalline or combinations thereof. As used herein "glass frit" or "frit" includes all such products.

Inorganic Additives

The instant paste composition also consists of certain inorganic additives. These inorganic additives are distinct components of the paste composition and are not part of the glass frit. The paste composition consists of 0.1-3 wt % $Bi_2O_3$ and 0-3 wt % metal selected from the group consisting of Cu, Zn, Ti, Mn, Fe, Co, Ni, Mo, Zr and mixtures thereof, based on the total weight of the paste. In an embodiment, the paste composition consists of 0.5-2 wt % $Bi_2O_3$. In an embodiment, the paste composition consists of 0.1-3 wt % metal selected from the group consisting of Cu, Zn, Ti, Mn, Fe, Co, Ni, Mo, Zr and mixtures thereof, based on the total weight of the paste. In another embodiment, the paste composition consists of 0.1-2 wt % metal selected from the group consisting of Cu, Zn, Ti, Mn, Fe, Co, Ni, Mo, Zr and mixtures thereof, based on the total weight of the paste. In one embodiment, the metal is Cu, Zn or a mixture of Cu and Zn and the paste composition consists of 0.1-3 wt % of a metal selected from the group consisting of Cu, Zn and mixtures thereof. In one such embodiment, the amounts of Cu and Zn are essentially equal. The metals may be in the form of metallic powders but also in the form of compounds that would provide the metals during the firing step.

Organic Medium

The inorganic components of the paste composition, i.e., the silver, powder, the glass frit and the inorganic additives are mixed with an organic medium to form viscous pastes having suitable consistency and rheology for printing. A wide variety of inert viscous materials can be used as the organic medium. The organic medium can be one in which the inorganic components are dispersible with an adequate degree of stability during manufacturing, shipping and storage of the pastes, as well as on the printing screen during the screen-printing process.

Suitable organic media have rheological properties that provide stable dispersion of solids, appropriate viscosity and thixotropy for screen printing, appropriate wettability of the substrate and the paste solids, a good drying rare, and good firing properties. The organic medium can contain thickeners, stabilizers, surfactants, and/or other common additives. One such thixotropic thickener is thixatrol. The organic medium can be a solution of polymer(s) in solvent(s). Suitable polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include bis [2-(2-butoxyethoxy)ethyl]adipate, dibasic esters such as DBE, DBE-2, DBE-3, DBE-4 DBE-5, DBE-6, DBE-9, and DBE 1B, octyl epoxy tallate, isotetradecanol, and pentaerythritol ester of hydrogenated rosin. The organic medium can also comprise volatile liquids to promote rapid hardening after application of the paste composition on a substrate.

The optimal amount of organic medium in the paste composition is dependent on the method of applying the paste and the specific organic medium used. The instant paste composition contains from 10 to 30 wt % of organic medium, based on the total weight of the paste composition.

If the organic medium comprises a polymer, the polymer typically comprises 0.1 to 5 wt %, based on the total weight of the paste composition.

Preparation of the Paste Composition

In one embodiment, the paste composition can be prepared by mixing silver powder, the glass frit powder, the bismuth oxide, the metal and the organic medium in any order. In some embodiments, the inorganic materials are mixed first, and they are then added to the organic medium. In other embodiments, the silver powder which is the major portion of the inorganics is slowly added to the organic medium. The viscosity can be adjusted, if needed, by the addition of solvents. Mixing methods that provide high shear are useful.

The paste composition can be deposited by screen-printing, plating, extrusion, inkjet, shaped or multiple printing, laminating or transfer. The deposition can be carried out in a single step or in two steps.

Electrode Forming Process

In this electrode-forming process, the paste composition is first dried and then heated to remove the organic medium and sinter the inorganic materials. The heating can be carded out in air or an oxygen-containing atmosphere. This step is commonly referred to as "firing". The firing temperature profile is typically set so as to enable the burnout of organic binder materials from the dried paste composition, as well as any other organic materials present. In one embodiment, the firing temperature is 750 to 950° C. The firing can be conducted in a belt furnace using high transport rates, for example, 100-500 cm/min, with resulting hold-up times of 0.05 to 5 minutes. Multiple temperature zones, for example 3 to 11 zones, can be used to control the desired thermal profile.

Preparation of Solar Cell

An example in which a solar cell is prepared using the paste composition of the present invention as the electrode on the back side of a solar cell in conjunction with a non-solderable aluminum electrode that covers the entire back side surface is explained with reference to FIG. 2.

First, a Si substrate 201 with a diffusion layer and an anti-reflection coating on the front side is prepared. On the light-receiving front side (surface) of the Si substrate, electrodes 202 typically mainly composed of Ag are formed. On the back side of the substrate, the non-solderable aluminum paste is deposited over the entire surface and dried. The solderable paste of the invention is then deposited on portions of the dried non-solderable aluminum paste and then dried. The drying temperature of each paste is preferably 150° C. or lower. In one embodiment the solderable paste of the invention is deposited over the entire surface of the dried non-solderable aluminum paste.

Figure 2:
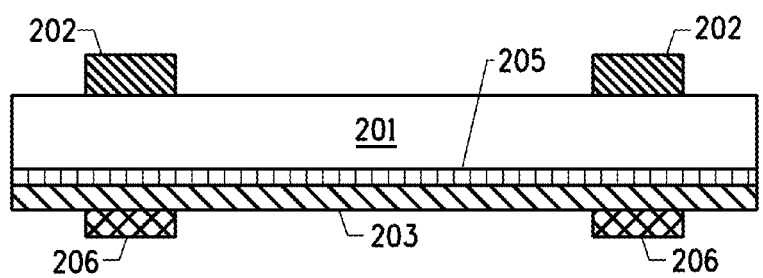
FIG. 2 illustrates the electrode configuration of a solar cell having a back side electrode consisting of an aluminum back side electrode (obtained by firing back side aluminum paste) covering the entire back side of the solar cell and tabbing bus bars (obtained by firing the paste of the invention) onto portions of the aluminum back side electrode.

Next, the substrate is fired at a temperature of 700-950° C. for about 1-15 min so that the desired solar cell is obtained as shown in FIG. 2. The electrode 206 is formed from the paste composition of the present invention wherein the composition has been fired to remove the organic medium and sinter the inorganics. When the pastes are fired aluminum diffuses into the silicon substrate 201 from the non-solderable aluminum paste to form a full area of back surface field layer 205. The solar cell obtained has electrodes 202 on the light-receiving front side of the substrate 201, and the non-solderable aluminum electrode 203 and the tabbing bus bars electrode 206 formed from the fired paste composition of the present invention on the back side. This tabbing configuration will be referred to herein as "floating tabbing" and the electrode formed as a "floating tabbing electrode".

In one embodiment, the tabbing bus bars electrode 206 is formed by screen printing the paste composition comprising silver powder and a glass frit containing 75-97 wt % $V_2O_5$, based on the total weight of the glass frit. In another embodiment the glass frit contains 85-97 wt % $V_2O_5$, based on the total weight of the glass frit. In another embodiment, the composition further comprises 0.1-3 wt % $Bi_2O_3$, based on the total weight of the paste composition. In still another embodiment, the paste composition consists of 0.1-3 wt % of a metal selected from the group consisting of Cu, Zn and mixtures thereof, based on the total weight of the paste composition.

Soldering of Tabbing Ribbons

Tabbing ribbons can be soldered to the solderable electrode formed from the paste composition of the invention by soldering the tabbing ribbon to the electrode using a low-melting alloy solder and a soldering iron heated to an appropriate temperature to melt the solder.

EXAMPLES

Glass Frit Preparation

A first glass frit was prepared by mixing and blending $V_2O_5$ and $B_2O_3$ powders to result in a first glass frit consisting of 92.2488 wt % $V_2O_5$ and 7.7512 wt % $B_2O_3$. The blended powder batch materials were loaded to a platinum alloy crucible then inserted into a furnace and heated at 900° C. in air or $O_2$ for one hour to melt the mixture. The liquid melt was quenched from 900° C. by removing the platinum crucible from the furnace and pouring the melt through counter rotating a stainless steel rollers gapped to 0.010-0.020". The resulting material was coarsely crushed in a stainless steel container. The crushed material was then ball-milled in an alumina-silicate ceramic ball mill with zirconia media until the $d_{50}$ was 1-4 microns. The ball-milled material was then separated from the milling balls and screened. The dried powder was run through screens with 40, 200, 325 or 500 mesh to provide the first glass frit powder used in the paste preparations described below.

A second glass frit was prepared by mixing and blending $V_2O_5$, $P_2O_5$ and $TiO_2$ powders to result in a second glass frit consisting of 81.3 wt % $V_2O_5$, 18.2 wt % $P_2O_5$ and 0.5 wt % $TiO_2$. The blended powder batch materials were treated as described above for the first glass frit to provide the second glass frit powder used in the paste preparations described below.

A third glass frit was prepared by mixing and blending $V_2O_5$, $B_2O_3$, $P_2O_5$ and $TiO_2$ powders to result in a third glass frit consisting of 91.2540 wt % $V_2O_5$, 7.0465 wt % $B_2O_3$, 1.6508 wt % $P_2O_5$ and 0.0487 wt % $TiO_2$. The blended powder batch materials were treated as described above for the first glass frit to provide the third glass frit powder used in the paste preparations described below.

Example 1

The paste was prepared by mixing silver powder, the first and second glass frit powders prepared above, $Bi_2O_3$, Cu powder, Zn powder and organic medium. The silver particles were added to the organic medium with continued stirring. Since the silver was the major portion of the solids it was added slowly to insure better wetting. The paste was then passed through a three-roll mill at a 1 mil gap several times. The degree of dispersion was measured by fine of grind (FOG) to insure that the FOG was less than or equal to 12/6. The viscosity of the paste was 102 Pa·s The proportions of ingredients used in this Example were 70 wt % silver powder, 9.44 wt % first glass frit powder, 0.92 wt % second glass frit powder, 1.00 wt % $Bi_2O_3$, 0.50 wt % Cu powder, 0.50 Zn powder and 17.64 wt % organic medium, based on the total weight of the paste.

Test Electrodes

In order to determine the adhesion properties of electrodes formed from the instant paste composition, the paste composition was screen printed onto an aluminum layer covering the back side surface of a silicon wafer. The paste composition was in the form of a tabbing bus bar. The paste was then dried and fired at a peak firing temperature of 750-780° C. in a belt furnace for 3-5 seconds. The thickness of the electrode was 6.64 µm.

Test Procedure-Adhesion

After firing, a solder ribbon was soldered to the fired paste. The solder used was 60Pb/40Sn. Solder iron temperature for the solder was 800° F. Flux used was 952S.

The soldered area was approximately 0.71 mm×2 mm. The adhesion strength of the solder ribbon to the silicon wafer was obtained by using an auto force gauge adhesion tester with horizontal 180 degree angle puffing and a pull speed of 120 mm/min. An assessment of the adhesion strength was assigned as low, adequate, or good, based on the assumption that an adhesion strength less than 2 N is considered low; values in the range of 2 N to 3 N is adequate, values in the range of 3 N to 4 N or above is good.

Adhesion was determined for the sample of Example 1 and the measurement was repeated over a hundred times. The average adhesion was 4.7 N.

A solar cell was prepared using the paste of this Example and the floating tabbing configuration. The efficiency was 0.18% greater than that of a solar cell with the traditional tabbing of FIG. 1.

Example 2

The paste was prepared by mixing silver powder, the first and second glass frit powders prepared above, $Bi_2O_3$ and organic medium as described in Example 1. The proportions of ingredients used in this Example were 70 wt % silver powder, 9.44 wt % first glass frit powder, 0.92 wt % second glass frit powder, 0.20 wt % $Bi_2O_3$ and 19.44 wt % organic medium, based on the total weight of the paste.

An electrode was prepared using this paste as described in Example 1. Adhesion was measured as described in Example 1. The thickness of the electrode was 7.88 µm. The average adhesion was 1.8 N.

Example 3

The paste was prepared by mixing silver powder, the first and third glass frit powders prepared above, $Bi_2O_3$, Cu powder, Zn powder and organic medium as described in Example 1. The proportions of ingredients used in this Example were 65 wt % silver powder, 5.42 wt % first glass frit powder, 5.94 wt % second glass frit powder, 1.00 wt % $Bi_2O_3$, 0.50 wt % Cu powder, 0.50 Zn powder and 21.64 wt % organic medium, based on the total weight of the paste.

An electrode was prepared using this paste as described in Example 1 except that the soldering temperature was 700° F. Adhesion was measured as described in Example 1. The thickness of the electrode was 6.04 µm. The average adhesion was 1.8 N.

A solar cell was prepared using the paste of this Example and the floating tabbing configuration. The efficiency was 0.06% greater than that of a solar cell with the traditional tabbing of FIG. 1.

Example 4

The paste was prepared by mixing silver powder, the first and third glass frit powders prepared above, $Bi_2O_3$, Cu powder and organic medium as described in Example 1. The proportions of ingredients used in this Example were 60 wt % silver powder, 5.42 wt % first glass frit powder, 5.94 wt % third glass frit powder, 1.00 wt % $Bi_2O_3$, 0.50 wt % Cu powder and 27.14 wt % organic medium, based on the total weight of the paste.

An electrode was prepared using this paste as described in Example 1 except that the soldering temperature was 700° F. Adhesion was measured as described in Example 1. The thickness of the electrode was 6.97 µm. The average adhesion was 1.8 N.

Example 5

The paste was prepared by mixing silver powder, the first and third glass frit powders prepared above, $Bi_2O_3$, Cu powder and organic medium as described in Example 1. The proportions of ingredients used in this Example were 65 wt % silver powder, 5.42 wt % first glass frit powder, 5.94 wt % third glass frit powder, 1.00 wt % $Bi_2O_3$, 0.50 wt % Cu powder and 22.14 wt % organic medium, based on the total weight of the paste.

An electrode was prepared using this paste as described in Example 1 except that the soldering temperature was 700° F., Adhesion was measured as described in Example 1. The thickness of the electrode was 6.24 µm. The average adhesion was 2.5 N.

Example 6

The paste was prepared by mixing silver powder, the first and third glass frit powders prepared above, $Bi_2O_3$, Cu powder, Zn powder and organic medium as described in Example 1. The proportions of ingredients used in this Example were 65 wt % silver powder, 4.70 wt % first glass frit powder, 5.16 wt % third glass frit powder, 1.00 wt % $Bi_2O_3$, 1.00 wt % Cu powder, 0.50 wt % Zn powder and 22.64 wt % organic medium, based on the total weight of the paste.

An electrode was prepared using this paste as described in Example 1 except that the soldering temperature was 700° F. Adhesion was measured as described in Example 1. The adhesion was deemed adequate.

Example 7

The paste was prepared by mixing silver powder, the first and third glass frit powders prepared above, $Bi_2O_3$, Cu powder, Zn powder and organic medium as described in Example 1. The proportions of ingredients used in this Example were 60 wt % silver powder, 5.42 wt % first glass frit powder, 5.94 wt % third glass frit powder, 0.50 wt % $Bi_2O_3$, 1.00 wt % Cu powder, 0.50 wt % Zn powder and 26.64 wt % organic medium, based on the total weight of the paste.

An electrode was prepared using this paste as described in Example 1 except that the soldering temperature was 700° F. Adhesion was measured as described in Example 1. The adhesion was deemed adequate.

What is claimed is:

1. A paste composition consisting of:
   (a) 40-80 wt % silver powder;
   (b) 3-20 wt % glass frit selected from the group consisting of (i) a first frit consisting of 85-97 wt % $V_2O_5$ and 3-15 wt % $B_2O_3$, (ii) a second frit consisting of 75-85 wt % $V_2O_5$, 13-23 wt % $P_2O_5$ and 0.1-2 wt % $TiO_2$, (iii) a third glass frit consisting of 85-97 wt % $V_2O_5$, 2-14 wt % $B_2O_3$, 0.1-4 wt % $P_2O_5$ and 0.01-1 wt % $TiO_2$ and (iv)

mixtures thereof, wherein the oxide wt % are based on the total weight of each glass frit, respectively:
(c) 0.1-3 wt % $Bi_2O_3$;
(d) 0-3 wt % metal selected from the group consisting of Cu, Zn, Ti, Mn, Fe, Co, Ni, Mo, Zr and mixtures thereof; and
(e) 10-30 wt % organic medium;
wherein the silver powder, the glass frit, the $Bi_2O_3$ and the metal are dispersed in the organic medium and wherein the wt % of the silver powder, the glass frit, the $Bi_2O_3$, the metal and the organic medium are based on the total weight of the paste composition.

2. The paste composition of claim 1, wherein said glass frit contains 85-97 wt % $V_2O_5$, based on the total weight of said glass frit.

3. The paste composition of claim 1, wherein said paste composition consists of 0.1-3 wt % of a metal selected from the group consisting of Cu, Zn and mixtures thereof, based on the total weight of the paste composition.

4. The paste composition of claim 1, said glass frit consisting of a mixture of said first glass frit and said third glass frit.

5. A solar cell comprising:
(i) an aluminum back side electrode covering the entire surface of the back side of the solar cell; and
(ii) a tabbing bus bar electrode formed by firing a paste composition, said paste composition consisting of:
(a) 40-80 wt % silver powder;
(b) 3-20 wt % glass frit selected from the group consisting of (i) a first frit consisting of 85-97 wt % $V_2O_5$ and 3-15 wt % $B_2O_3$, (ii) a second frit consisting of 75-85 wt % $V_2O_5$, 13-23 wt % $P_2O_5$ and 0.1-2 wt % $TiO_2$, (iii) a third glass frit consisting of 85-97 wt % $V_2O_5$, 2-14 wt % $B_2O_3$ 0.1-4 wt % $P_2O_5$ and 0.01-1 wt % $TiO_2$ and (iv) mixtures thereof, wherein the oxide wt % are based on the total weight of each glass frit, respectively:
(c) 0.1-3 wt % $Bi_2O_3$;
(d) 0-3 wt % metal selected from the group consisting of Cu, Zn, Ti, Mn, Fe, Co, Ni, Mo, Zr and mixtures thereof; and
(e) 10-30 wt % organic medium;
wherein the silver powder, the glass frit, the $Bi_2O_3$ and the metal are dispersed in the organic medium, wherein the wt % of the silver powder, the glass frit, the $Bi_2O_3$, the metal and the organic medium are based on the total weight of the paste composition and wherein the paste composition is deposited onto portions of the aluminum back side electrode.

6. The solar cell of claim 5, wherein said glass frit contains 85-97 wt % $V_2O_5$, based on the total weight of said glass frit.

7. The solar cell of claim 5, wherein said paste composition consists of 0.1-3 wt % of a metal selected from the group consisting of Cu, Zn and mixtures thereof, based on the total weight of the paste composition.

8. The paste composition of claim 1, said glass frit consisting of said first glass frit.

9. The solar cell of claim 5, said glass frit consisting of said first glass frit.

* * * * *